United States Patent [19]

Miyabayashi

[11] Patent Number: 5,157,422
[45] Date of Patent: Oct. 20, 1992

[54] SOLID IMAGING MEMBER WITH MATRIX OF CONNECTED PHOTOELECTRIC CONVERSION DEVICES, PROVIDING EXPOSURE SURFACE, AND CHARGE STORAGE DEVICES, PROVIDING OPPOSITE SURFACE FOR LATENT IMAGE FORMATION AND DEVELOPED IMAGE TRANSFER

[75] Inventor: Takeshi Miyabayashi, Nagoya, Japan

[73] Assignee: Brother Kogyo Kabushiki Kaisha, Aichi, Japan

[21] Appl. No.: 450,814

[22] Filed: Dec. 14, 1989

[30] Foreign Application Priority Data

Dec. 16, 1988 [JP] Japan ............................. 63-318873
Jan. 18, 1989 [JP] Japan ............................. 1-9070
Jan. 18, 1989 [JP] Japan ............................. 1-9071

[51] Int. Cl.⁵ .................. G03B 5/047; G03B 15/048; G03B 15/01; H04N 5/335; H04N 9/09
[52] U.S. Cl. ........................ 346/153.1; 346/157; 355/211; 355/327; 358/43; 358/213.12; 358/482
[58] Field of Search ............ 358/300, 471, 480, 481, 358/482, 209, 212, 213.11, 213.12, 213.14, 43, 44; 346/153.1, 160, 157; 355/211, 210, 327

[56] References Cited

U.S. PATENT DOCUMENTS

| | | | |
|---|---|---|---|
| 2,221,776 | 11/1940 | Carlson | 355/210 |
| 4,151,553 | 4/1979 | Sugihara | 358/44 |
| 4,448,867 | 5/1984 | Ohkubo | 346/153.1 |

Primary Examiner—Benjamin R. Fuller
Assistant Examiner—Scott A. Rogers
Attorney, Agent, or Firm—Kane, Dalsimer, Sullivan, Kurucz, Levy, Eisele and Richard

[57] ABSTRACT

In a copying apparatus employing a light source for illuminating an original subject to be copied and forming a toner image corresponding to said original subject on a recording medium, a solid imaging device is employed for converting a reflected light from the original subject into electric charge and storing the electric charge therein. The solid imaging device is provided with a chargeable surface on which the electric charge is to be collected. By applying a toner onto the charged portion of the surface of the solid imaging device, an image on the original subject is copied repeatedly, with a single exposure system for illuminating the original subject.

18 Claims, 8 Drawing Sheets

SOLID IMAGING MEMBER WITH MATRIX OF CONNECTED PHOTOELECTRIC CONVERSION DEVICES, PROVIDING EXPOSURE SURFACE, AND CHARGE STORAGE DEVICES, PROVIDING OPPOSITE SURFACE FOR LATENT IMAGE FORMATION AND DEVELOPED IMAGE TRANSFER

BACKGROUND OF THE INVENTION

This invention relates to a copying apparatus employing a solid imaging device.

Conventionally, there is known an copying apparatus utilizing an electrophotographic system in which a surface of an original subject is scanned with a light, a solid imaging device such as CCD (Charge Coupled Device) is illuminated with a reflecting light from the original subject, then a bit map image data converted in the CCD is temporarily stored in a memory. A circumferential surface of a photoconductive drum is exposed to the light such as laser beam which is ON/OFF modulated in accordance with the data stored in the memory so as to form a latent image on the drum surface, a toner is then sprayed onto the latent image surface, and the toner image is transferred onto a recording medium (paper).

In the CCD, electric charge photoelectrically converted by an photoelectric conversion device is stored in an electric charge storage composed of junctions of semiconductor devices. By controlling the potential of the semiconductor devices, the electric charge stored in each condenser is output in sequence.

However, the amount of the surface charge stored in the CCD is too small to allow some work to be externally done. Likewise, when large amount of light is exposed to the CCD, it is easily saturated and thereby a wide dynamic range cannot be obtained.

Moreover, since electric charges are serially moved by controlling the potential of the CCD as described above, the loss of electric charge during the movement thereof is not constant. Consequently, even if the CCD receives the same amount of light at any position on the surface thereof, the amount of electric charge photoelectrically converted at each position depends on the position where the light is irradiated.

Furthermore, in the conventional copying apparatus, because a process for scanning the circumferential surface of the photoconductive drum is required as well as that for the surface of the original subject, it takes much time to record an image. In addition, since both the surface of the original subject and the circumferential surface of the photoconductive drum should be individually scanned, two exposure systems are required, thereby the construction of the copying apparatus is complicated.

An object of the present invention is to provide an improved solid imaging device having a matrix of electric charge storage of high capacity in which the loss of the electric storage charge amount can be independent of the position where light is irradiated. The light having an image data being irradiated onto the photoelectric conversion device is photoelectrically converted and stored in each electric charge storage of the solid imaging device disposed in accordance with each element of the photoelectric conversion device. By electrostatically spraying a toner onto the charged surface of each electric charge storage, an image can be copied with a single exposure system, thereby the structure of the device is simplified as well as made compact and the copying time of an image is reduced.

For this purpose, according to this invention, there is provided a copying apparatus employing a light source for illuminating an original subject to be copied and forming a toner image corresponding to the original subject on a recording medium, the apparatus comprises:

solid imaging means for converting a reflected light from the original subject into electric charge and for storing the electric charge therein, the solid imaging means being provided with a chargeable surface on which the electric charge is to be collected;

developing means for applying toner onto the charged portion of the surface of the solid imaging means to form a toner image; and transferring means for transferring the toner image formed on the surface of the solid imaging means onto the recording medium.

DESCRIPTION OF THE ACCOMPANYING DRAWINGS

Figure 6:
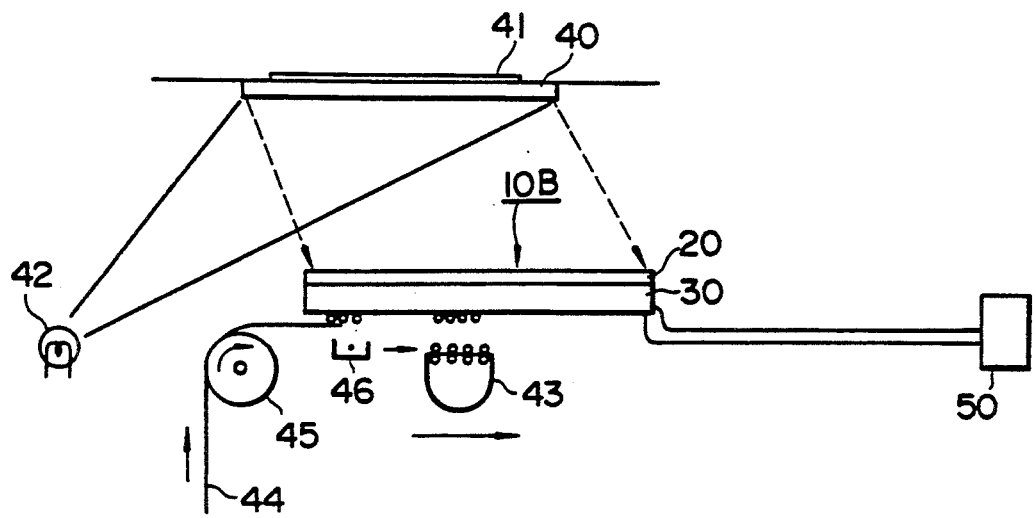
Figure 7:
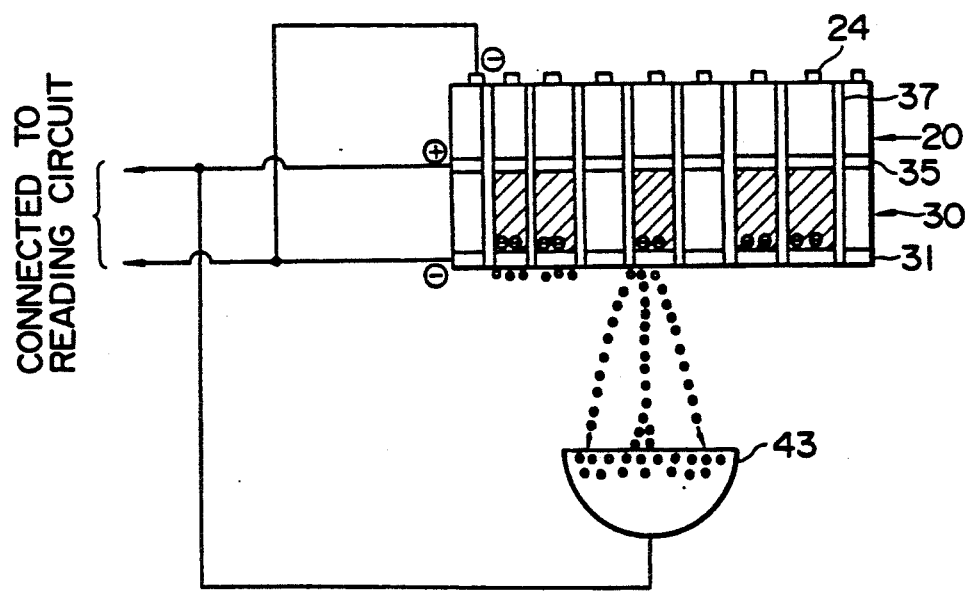
Figure 8:
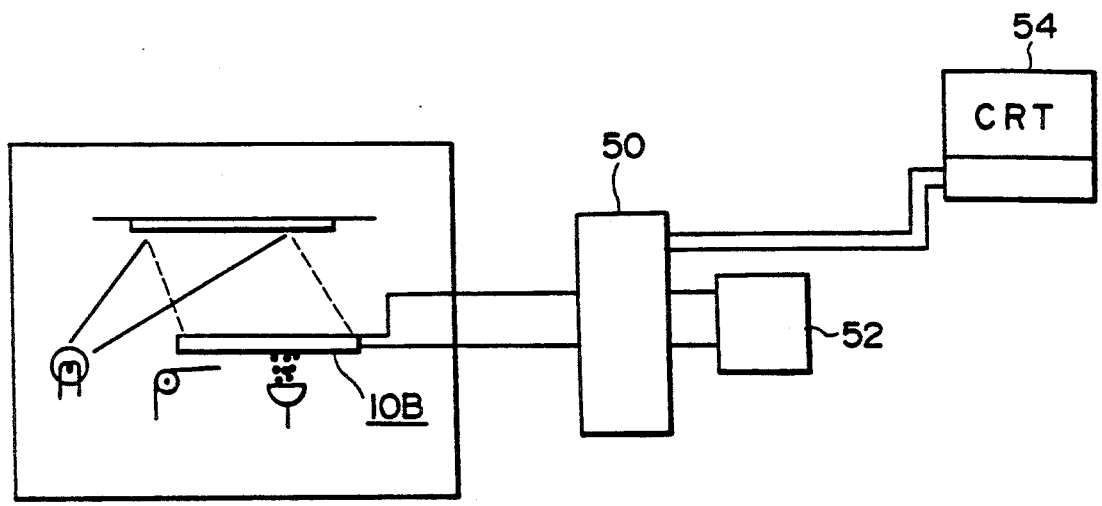
Figure 9:
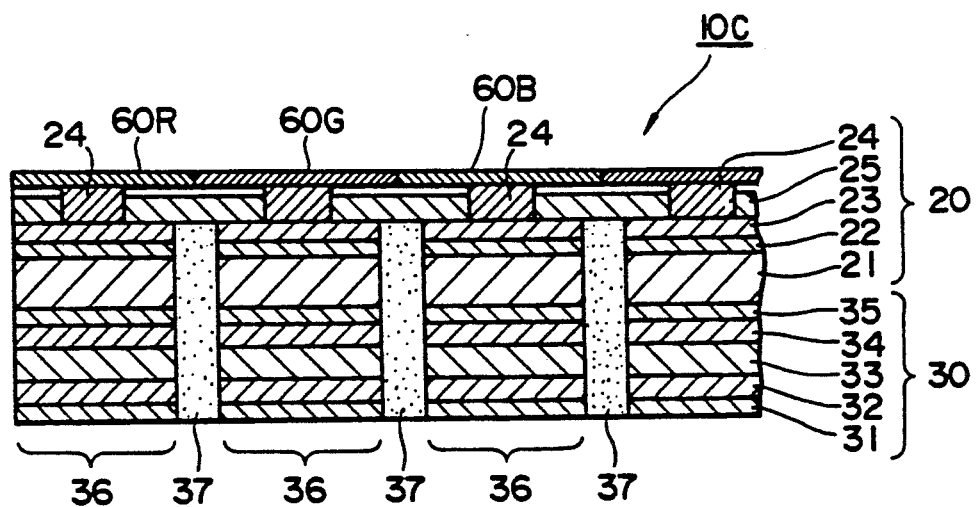
Figure 10:
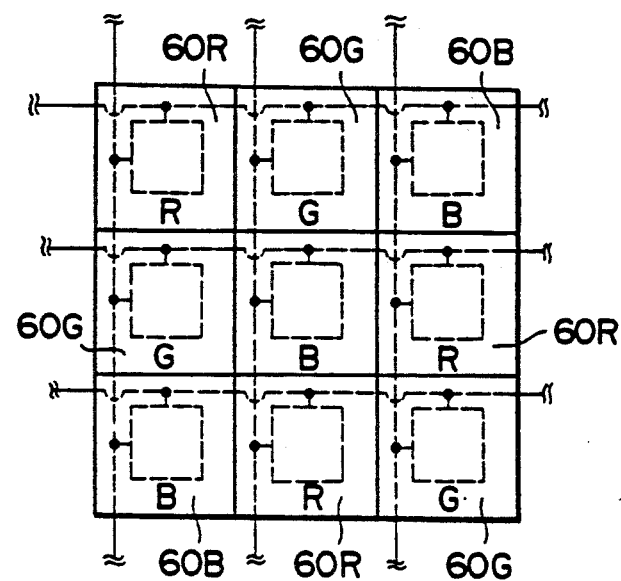
Figure 11:
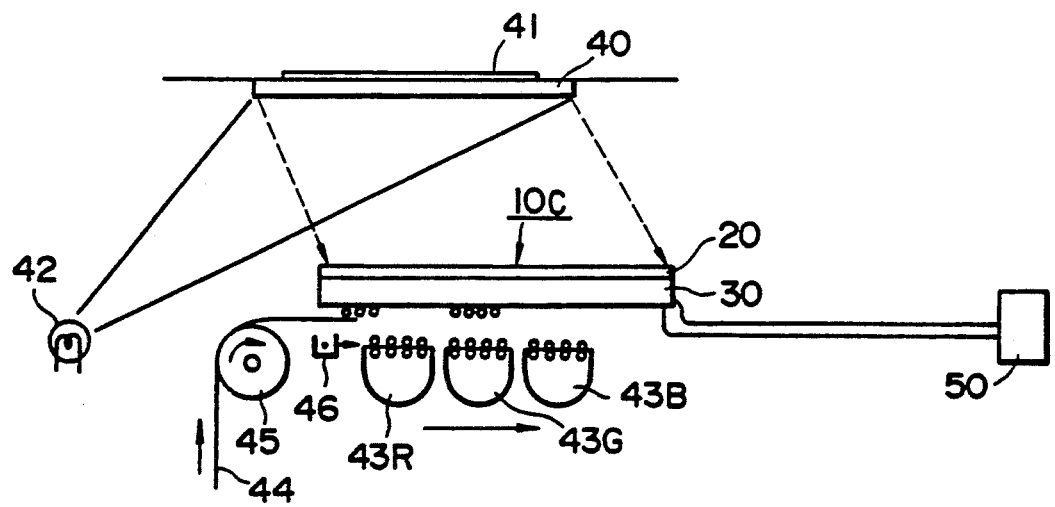
Figure 12:
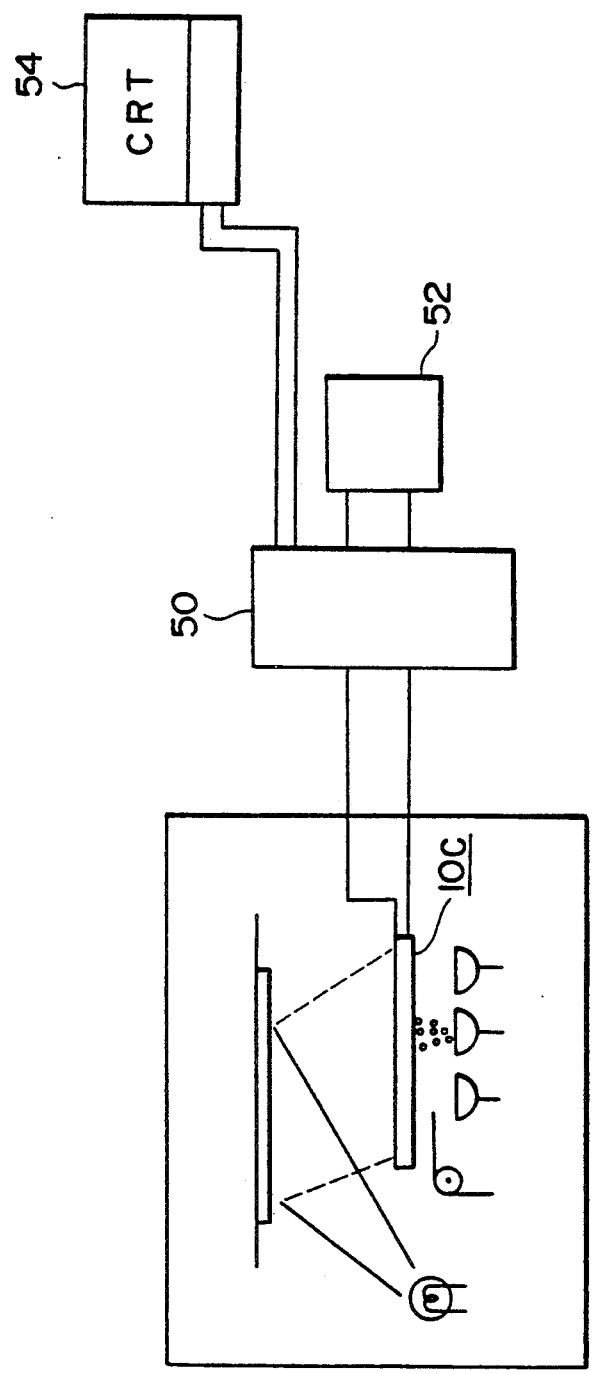

FIGS. 4 (a) through (h) are outlined descriptive diagrams of the production step of the solid imaging device 10B;

FIG. 5 (a) is a top view of FIG. 4 (c);

FIG. 5 (b) is a top view of FIG. 4 (f);

FIG. 5 (c) is a top view of FIG. 4 (h);

FIG. 6 is an outlined structural diagram of a copying apparatus employing a solid imaging device 10B;

FIG. 7 is a descriptive diagram of a toner spray gun 43;

FIG. 8 is a descriptive diagram of the control circuit of the copying apparatus employing a solid imaging device 10B;

FIG. 9 is a structural schematic sectional view of another modification 10C of solid imaging device;

FIG. 10 is a top view of the solid imaging device 10C;

FIG. 11 is an outlined structural diagram of a copying apparatus employing a solid imaging device 10C; and FIG. 12 is a descriptive diagrams of the control circuit of the copying apparatus employing a solid imaging device 10C.

DESCRIPTION OF THE EMBODIMENTS

Figure 1:
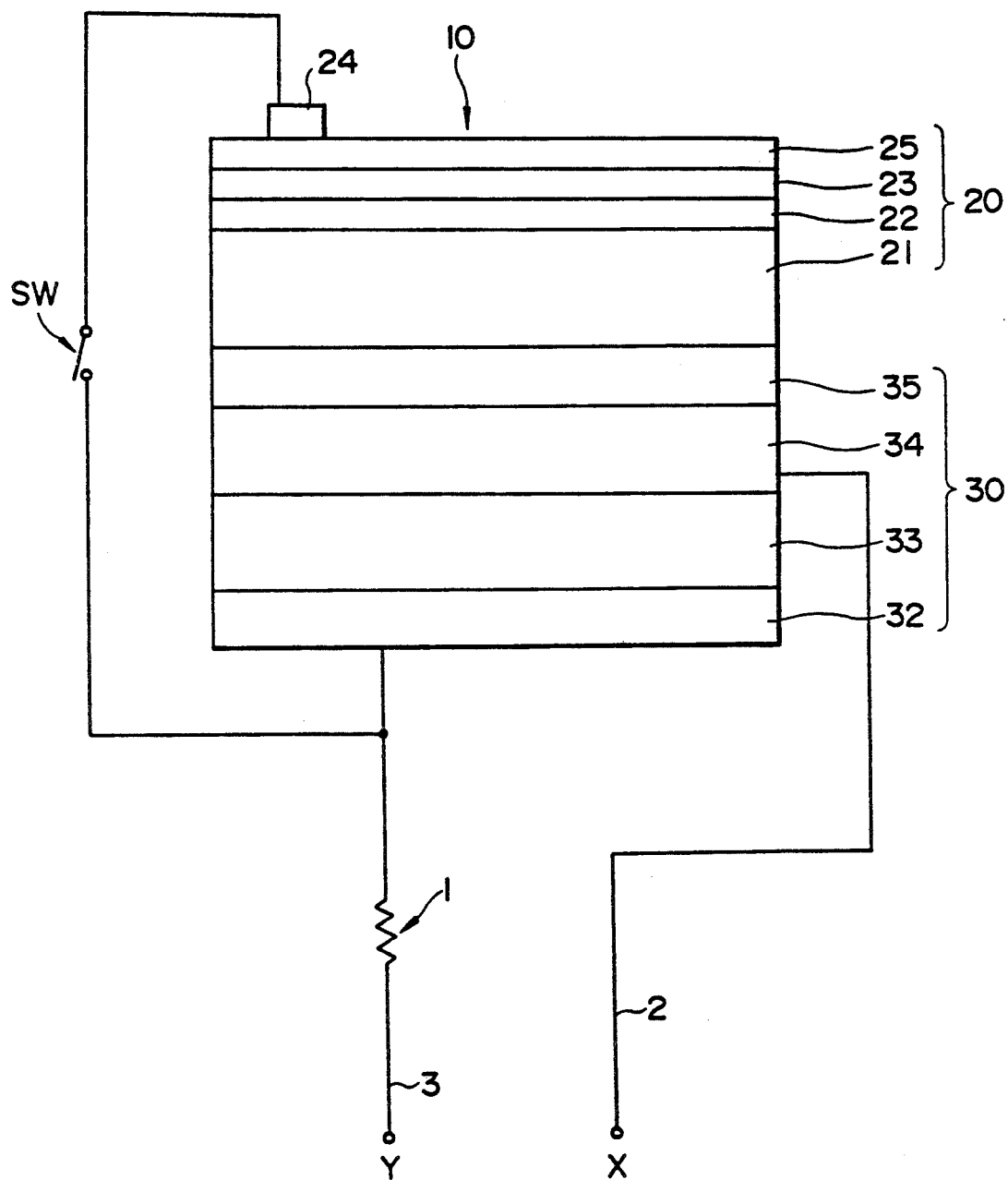
FIG. 1 is a structural schematic view of a picture element of a solid imaging device according to the present invention.

FIG. 1 shows an embodiment of a structure of a picture element 10 of the solid imaging device according to the present invention.

The element 10 falls into a photoelectric conversion device 20 and an electric charge storage device 30. The electric charge storage section 30 is composed of a solid electrolyte layer ($LiBrLi_8P_4O$, etc.) 33 nipped between an anode 34 made of composite material ($V_6O_{13}$, etc.) and a cathode 32 made of (Li) lithium containing alloy or (Li-Al) lithium-aluminum containing alloy, a collector layer 35 made of (Ni) nickel being provided on the surface of the anode 34. The electric charge storage device 30 is produced in the following manner. First, the cathode 32 is made by evaporating the lithium-aluminum containing alloy. Using CVD (Chemical Vapor Deposition) method, solid electrolyte layer 33 and composite material 34 are formed on the cathode 32. After that, Ni as an anode collector layer 35 is evaporated on the composite material 34.

The photoelectic conversion device 20 is disposed on the anode collector layer 35. The photoelectric conversion device 20 is composed of an amorphous P (Positive) type silicon, an I (Intrinsic) type silicon, and an amorphous N (Negative) type silicon, each of which is layered by using plating method. An anti-reflection film 25 and a surface electrode 24 are disposed at the top of the photoelectric conversion device 20 of the element 10.

In addition, with a circuit pattern formed by photoetching method in and on a semiconductor film, not shown, a semiconductor switch SW is provided between the surface electrode 24 and the cathode 32. An X-terminal 2 is provided from the anode 34 and a Y-terminal 3 is provided from the cathode 32 through a resistor 1.

When the semiconductor switch SW is closed, the electric charge which was produced in the photoelectric conversion device 20 flows into the electric charge storage device 30, and is stored. When the output impedance between the X-terminal 2 and the Y-terminal 3 is set to infinite value, all the electric charge is stored, not discharged. Since the capacity of the electric charge storage device 30 is remarkably larger than the conventional substitute, it is not saturated by the electric charge. Thus, the amount of the electric charge stored in the electric charge storage device 30 is proportional to the integrated value of the received light amount.

When the semiconductor switch SW is opened and the output impedance between the X-terminal 2 and the Y-terminal 3 is decreased, the corresponding current flows between both the terminals 2 and 3.

Figure 2:
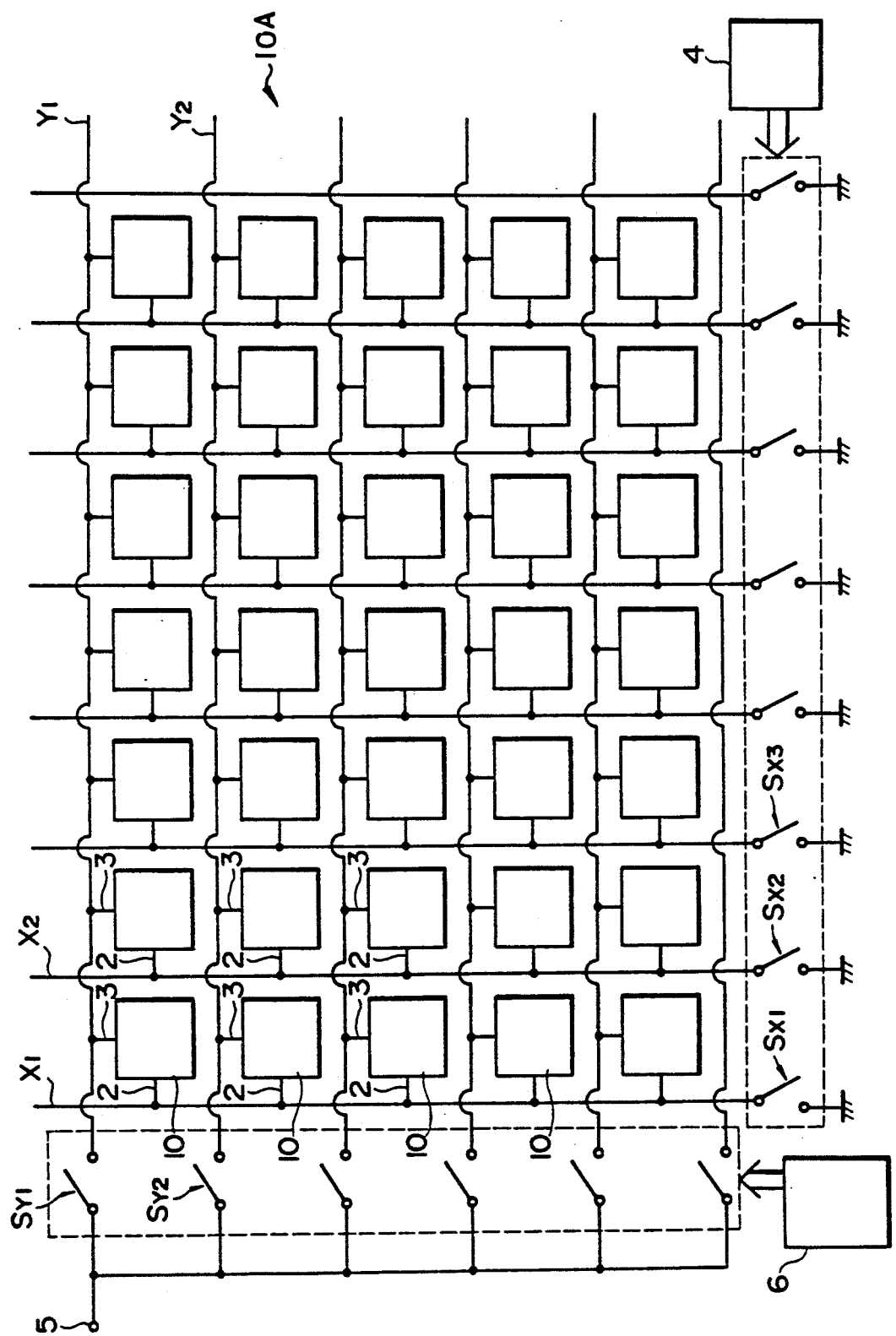
FIG. 2 is a structural schematic view of the solid imaging device 10A.

A solid imaging device 10A is formed with a matrix of elements 10 described above as shown in FIG. 2. The X-terminal 2 on each column and the Y-terminal 3 on each row are electrically connected to a respective buses X1, X2, . . . and Y1, Y2, . . . .

The buses X1, X2, . . . are connected to the ground potential through switches Sx1, Sx2, . . . , respectively. The switches Sx1, Sx2, . . . are controlled by a control circuit 4 so that only one switch is closed at a time. On the other hand, the Y1, Y2, . . . are connected to an output terminal 5 through switches Sy1, Sy2, . . . , respectively. The switches Sy1, Sy2, . . . are controlled by a control circuit 6 so that only one switch is closed at a time.

When all the semiconductor switches SW (refer to FIG. 1) of the solid imaging device 10A are closed and an image is optically focused on the solid imaging device 10A, electric charge produced in each element of the photoelectric conversion device 20 is stored in corresponding electric charge storage device 30. After a predetermined period for integration elapses, the semiconductor switches SW are opened. After that, only the switch Sy1 which is electrically connected to the bus Y1 is closed with other switches Sy2, . . . being opened by the control circuit 6. While the switch Sy1 is closed, the switches Sx1, Sx2, . . . are closed in sequence by the control circuit 4. At the time, the electric charge stored in each electric charge storage device 30 flows to the outside rightwardly from the upper left position shown in FIG. 2. This electric charge is amplified by a low-impedance amplifier and the current is converted into a voltage so as to produce an image data. After this process is completed for all the elements 10 of the solid imaging device 10A, i.e. the switch Sy1 is open and the switch Sy2 is closed, thereby repeating the same process. In other words, by closing one of switches Sx1, Sx2, . . . , the horizontal scanning is conducted and one of the switches Sy1, Sy2, . . . , the vertical scanning is conducted.

The solid image pickup device can also be widely used besides the operation described above. For example, by closing only the switches connected to each element 10 on the odd rows one by one and then by opening them and closing those on the even rows one by one, an interlaced scanning can be conducted. At the time, for example, while the switches Sy1, Sy3, . . . on the odd rows are being closed one by one, each semiconductor switch SW of each element 10 on the odd rows is closed and while the switches Sy2, Sy4, . . . on the even rows are being closed one by one, each semiconductor switch SW of each element 10 on the odd rows is closed. Then, the integration operation can be conducted along with the scanning operation, a high speed operation is available and thereby a motion picture can be processed.

In addition, when a still picture is recorded, by lengthening the integration time, the sufficient electric charge can be stored so that the device works to the outside. In this case, for example, a process for applying a charged toner is possible without using the amplifier described above.

Further, since the solid imaging device according to the present invention has no scanning process function therein, data is read by addressing one of the elements of the solid imaging device 10A one by one with the external control units (control circuits 4 and 6). Thus, the solid imaging device can perform both an interlaced scanning and a non-interlaced scanning. In addition, data can be scanned from and at any desired position unlike the conventional device employing the CCD.

Figure 3:
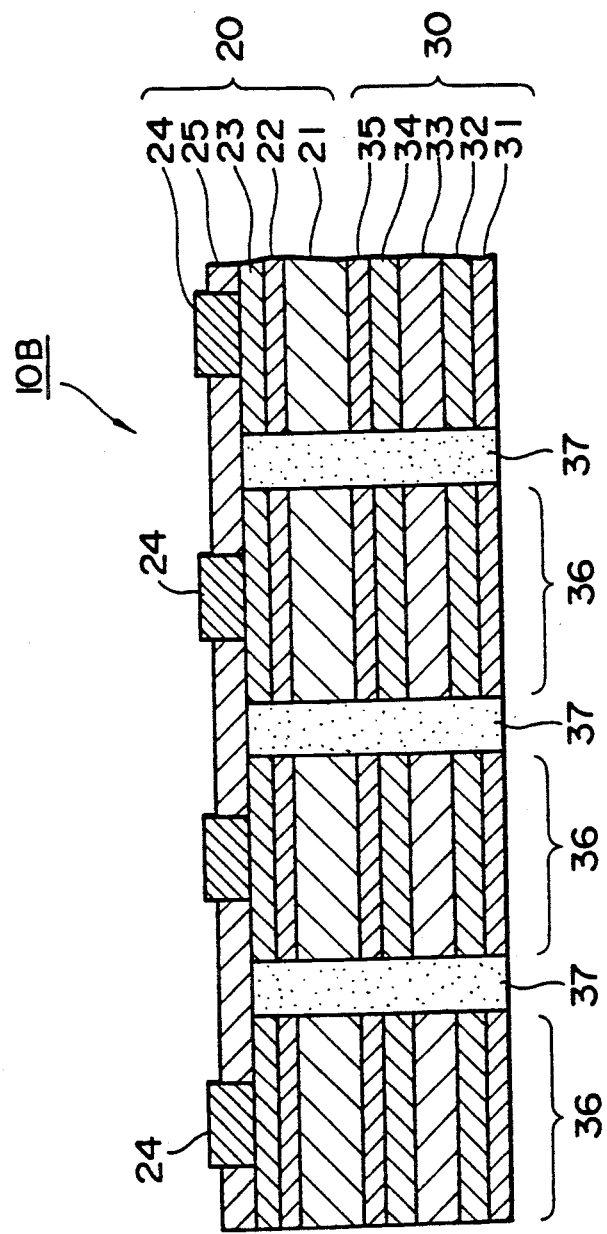
FIG. 3 is a structural schematic sectional view of a modification 10B of a solid imaging device.
Figure 4A:
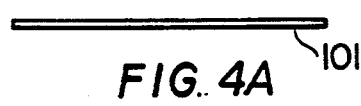
Figure 4B:
Figure 4C:
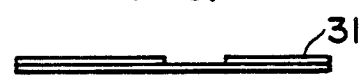
Figure 4D:
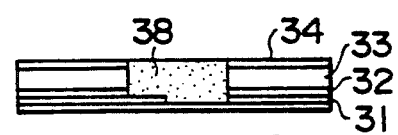
Figure 4E:
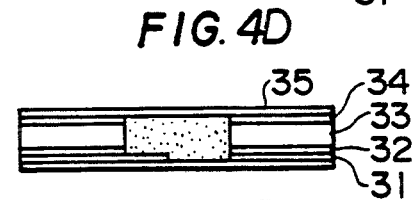
Figure 4F:
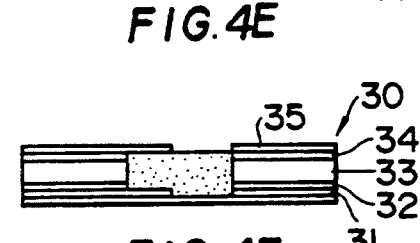
Figure 4G:
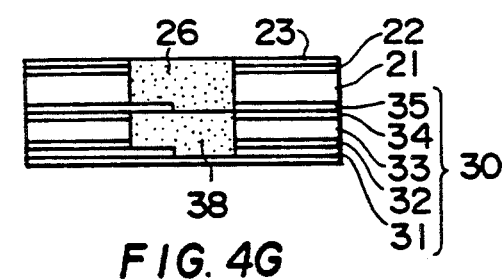
Figure 4H:
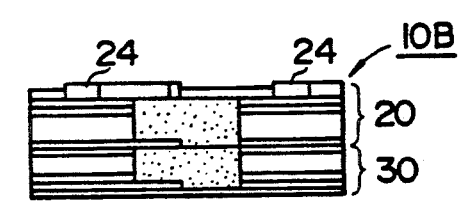

FIG. 3 shows the structure of a modified solid imaging device 10B, which is composed of a photoelectric conversion device 20 and an electric charge storage device 30 which is connected to and incorporated at the rear thereof. The photoelectric conversion device 20 is a so-called PIN junction type where a P (Positive) type silicon 21, an I (Intrinsic) type silicon 22, and an N (Negative) type silicon 23 are layered in the order, a large number of Al (aluminum) surface electrodes 24 being arranged in a matrix on the N type silicon 23, an anti-reflection film 25 made of silicon dioxide ($SiO_2$) being nipped between the aluminum surface electrodes 24. The electric charge storage device 30 is composed of a cathode collector 31 made of Ni (nickel) on which a cathode layer 32 made of Li (lithium), a solid electrolyte layer 33 made of $LiBrP_4O$, a composite type anode layer 34, and an anode collector 35 are layered in the order. The P type silicon 21 of the photoelectric conversion device 20 and the anode collector 35 of the electric charge storage device 30 form the junction surfaces.

Separators 37 made of polyimido resin are placed on both top and bottom surfaces of the solid imaging device 10B so that the area including one surface electrode 24 is formed as one picture element and a plurality of electric charge storage cells 36 are formed according to each picture element.

Figure 5A:
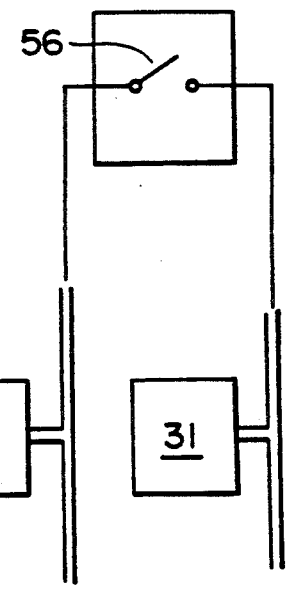
Figure 5B:
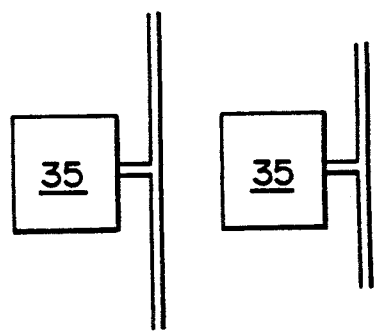
Figure 5C:
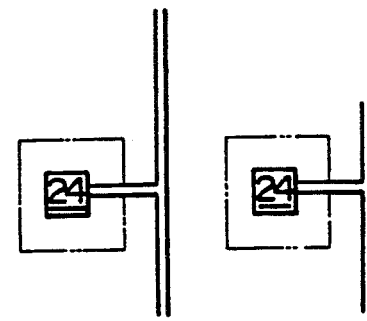

The detail of the production process of the solid imaging device 10B is illustrated in FIG. 4. On a thin shape plastic base 101, Ni material as a cathode collector 31 is formed using one of various film forming methods such as evaporation method, sputtering method, ion plating method, CVD (Chemical Vapor Deposition) method, and plating method (see FIGS. 4(a) and (b)). Next, the base of the matrix of the electric charge storage cells 36 is formed by patterning the cathode collector 31 in the well-known pattern etching method (FIG. 4(c)). The entire surface of the base is covered with the polyimido resin which is the material of the separators 37. Then, using the photolithograph method, the base surface of each electric charge storage cell 36 is removed and a mask portion 38 is filled between the bases. On the base, the cathode 32 of Li, the solid electrolyte 33, and anode 34 of $V_6O_{13}$ anode are layered using the film forming method and the pattern etching method (FIG. 4(d)). After that, the Ni layer which is the anode collector 35 is formed thereon (FIG. 4(e)). By etching the pattern, the electric charge storage device 30 is formed (FIG. 4(f)). After that, on the electric charge storage device 30, the photoelectric conversion device 20 is formed. First, on the pattern etching layer of the anode collector 35, the P type silicon layer 21, the I type silicon layer 22, and the N type silicon layer 23 are formed in the order. Thus, the matrix of elements are sectioned using the film forming method and the pattern etching method. Between individual picture elements, the polyimido resign is filled to form the mask portion 26 (FIG. 4(g)). By etching the pattern of the surface electrode layer, the surface electrodes 24 according to each picture element are formed. Between the space of the individual surface electrodes 24, the anti-reflection film 25 is formed and thereby the solid imaging device 10B is produced. FIGS. 5(a) through (c) are top views of FIGS. 4(c), (f), and (h). The elements of the solid imaging device 10B and the electric charge storage cells 36 are arranged in matrix and connected to a control circuit 50 described later.

FIG. 6 illustrates a structure of a copying apparatus employing a solid imaging device according to another modification.

In the copying apparatus of the FIG. 6, an original material 41 is placed on a transparent plate 40. By irradiating light from a light source 42 to the original material 41 through the plate 40, the reflected light is irradiated to the photoelectric conversion device 20 at the top of the solid imaging device 10B which is opposed to the plate 40 at a predetermined distance. In this case, when a monochrome original subject is used, electric charge is produced only at each element of the photoelectric conversion device 20 according to the white section of the original material 41 because the light is reflected at the white section and the reflected light illuminates the surface of the photoelectric conversion device 20 of the solid imaging device 10B. The electric charge is converted into electric energy and stored in the electric charge storage cells 36 according to the battery device 30 which is connected to the rear of the photoelectric conversion device 20.

On the other hand, below the solid imaging device 10B, a toner spray gun 43 is disposed on the opposite side of the electric charge storage device 30 with a small distance in such a manner that it is horizontally movable. After the reflected light illuminates the surface of the solid imaging device 10B, by operating the toner spray gun, as shown in FIG. 7, the toner is sprayed on the electric charge storage cells 36. In this case, the toner is charged reversely of the charged surface of each electric charge storage cell 36 in polarity. After that, a recording paper 44 is sent to the bottom of the solid imaging device 10B by way of a paper feed roller 45. Using toner transfer means 46 employing such as the corotron method like the conventional electrophotographic copying apparatus, a toner image is transferred onto the recording paper 44.

FIG. 8 shows a control system of the copying apparatus employing the solid imaging device 10B.

The solid imaging device 10B is electrically connected to a bit map data read/write controller 50 which can read the electric charge distribution stored in each electric charge storage cell 36 of the electric charge storage device 30 as bit map data and can write the bit map data to each electric charge storage cell 36. The controller 50 is electrically connected to a memory 52 which temporarily stores the bit map data which is read from the electric charge storage device 30 and a CPU (Central Processing Unit) 54 having a keyboard for handling the bit map data to enlarge, reduce or correct an image and a CRT (cathode lay tube) for displaying the bit map data.

Thus, the electric charge distribution stored in the electric charge storage device 30 of the solid imaging device 10B is input to the controller 50 as the bit map data when each switching device 56 is turned on (refer to FIG. 5). The electric charge distribution is temporarily stored in the memory 52. The image data is sent from the memory 52 to the electric charge storage device 30 through the controller 50, so that the related electric charge storage cell 36 is recharged and the latent image is formed. Thereby, the same image can be recorded repeatedly.

FIGS. 9 and 10 show still another modified solid imaging device 10C.

The solid imaging device 10C comprises a plurality of optical filters 60, each of which selectively transmits the light of certain wavelength. The filters 60 are provided on the surface of the photoelectric conversion device 20. In this modification, R (red), G (green), and B (blue) light transmissive filters 60 (60R, 60G and 60B) are used. The optical filters 60 (60R, 60G, and 60B) are regularly disposed in matrix according to each element 10 of the solid imaging device 10C as shown in FIG. 10.

By applying the color filters 60 on the aforementioned solid imaging device 10B, the solid imaging device 10C is produced.

FIG. 11 illustrates the outlined structure of the copying apparatus employing the solid imaging device 10C structured in the above manner.

In the copying apparatus of FIG. 11, an original subject 41 is placed on a transparent plate 40. By irradiating light from a light source 42 to the original subject 41 through the plate 40, the reflected light illuminates the photoelectric conversion device 20 through the optical filters 60 (60R, 60G, and 60B) at the top of the solid imaging device 10C which is opposed to the plate 40 at a predetermined distance. In this case, all of the light passed through the optical filters 60 (60R, 60G and 60B) are photoelectrically converted into the electric charge. First, the electric charge according to the light through the R (or G, B) filters is stored in the electric charge storage devices 20 and those according to the other filters are discharged from the electric charge storage device 20. The electric charge is converted into electric energy and stored in the electric charge storage cells 36 according to the electric charge storage device 30 which is electrically connected to the rear of the photoelectric conversion device 20.

On the other hand, below the solid imaging device 10C, toner spray gun 43s (43R, 43G, and 43B) for red, green, and blue colors is disposed on the opposite side of the electric charge storage device 30 in such a manner that it is horizontally movable. After the reflected light illuminates the solid imaging device 10C, by selectively operating the toner spray guns 43R (or 43G, 43B) as shown in FIG. 7, the toner is sprayed on the electric charge storage cells 36 according to the element of the photoelectric conversion device 20 where the reflected light is received. After that, a recording paper 44 is sent to the bottom of the solid imaging device 10C by way of a paper feed roller 45. Using toner transfer means 46 employing such as the corotron method like the conventional electrophotographic type copying machine, a toner image is transferred to the recording paper 44. The same processes according to respective colors are repeated, then a color image is copied.

FIG. 12 illustrates the control system of the copying apparatus described above. The solid imaging device 10C is electrically connected to a bit map data read/write controller 50 which can read the electric charge distribution stored in each electric charge storage cell 36 as bit map data through a switching device 56 electrically connected to each electric charge storage cell 36 and can write the bit map data to each electric charge storage cell 36. The controller 50 is provided with memories 52 (52R, 52G, and 52B) which temporarily store the bit map data of each color read from the electric charge storage device 30, a CPU 54 having a keyboard for handling the bit map data to enlarge, reduce or correct an image, and a CRT (cathode ray tube) for displaying the bit map data.

Thus, the electric charge distribution stored in the battery device 30 of the solid imaging device 10C is input to the controller 50 as the bit map data of each color when each switching device 56 is turned on (refer to FIG. 5). The electric charge distribution is temporarily stored in the memory 52 as a color image data. The color image data is sent from the memory 52 to the electric charge storage device 30 with the controller 50, so that the related electric charge storage cell 36 is charged and the toner image is formed. Thus, the color image is obtained. First, for example, the red image bit map information is obtained. And the red color toner is sprayed to the electric charge storage device 30 and transferred to the recording paper 44. After that, the electric charge storage device 30 is discharged, then the green color bit map data and the blue color image bit map data are transmitted, then the green color toner and the blue color toner are sprayed to the electric charge storage device 30 and transferred to the recording paper 44, respectively. Thus, the desired color image can be obtained. In addition, as the bit map data stored in the memory 52 can be transmitted to the electric charge storage devices 30 repeatedly, the same color image may be copied repeatedly.

As described above, according to the present invention, a color image can be produced with a single exposure system and thereby the apparatus can be structured simple and the color image can be produced in relatively small number of exposure operations. Thus, the image recording time can be reduced.

In addition, when a latent image formed on the solid imaging device is stored in the memory as a bit map data for each color and then it is returned back to the solid imaging device repeatedly, the color image is obtained for a number of times in one exposure operation.

What is claimed is:

1. A copying apparatus employing a light source for illuminating an original subject to be copied and forming a toner image corresponding to said original subject on a recording medium, said apparatus comprises:
   solid imaging means including: a plurality of photoelectric conversion devices for converting a reflected light from said original subject into electric charge, an equal plurality of electric storage devices for storing said electric charge therein, each of said electric storage devices corresponding to one of said photoelectric conversion devices and having a collecting surface on which said electric charge is to be collected, and connecting means for connecting a selected pair of said photoelectric conversion devices and said electric charge storage devices for a predetermined time;
   developing means for applying toner onto a charged portion of a surface of said solid imaging means to form a toner image; and
   transferring means for transferring said toner image formed on said surface of said solid imaging means onto said recording medium.

2. The copying apparatus according to claim 1, wherein each of said electric charge storage devices comprises an anode made of composite material and a cathode made of lithium containing metals with polyelectrolyte material therebetween.

3. The copying apparatus according to claim 2, which further comprises a plurality of kinds of optical filters, each of said optical filters transmitting light having a predetermined wavelength, each of said optical filters being provided on surface of a corresponding one of said photoelectric conversion devices; wherein said developing means comprises a plurality of toner applying means for applying toner of a color corresponding to said predetermined wavelength; and wherein said transferring means transfers said toner applied on said collecting surfaces onto said recording medium.

4. A copying apparatus employing a light source for illuminating an original subject to be copied and forming a toner image corresponding to said original subject on a recording medium, said apparatus comprises:
   solid imaging means including a matrix of photoelectric conversion devices for photoelectrically converting a reflected light from said original subject into an electric charge, a matrix of electric charge storage devices for storing said electric charge, each of said matrix of electric charge storage devices corresponding to each of said matrix of photoelectric conversion devices, and having a collecting surface on which said electric charge is to be collected, and connecting means for connecting a selected pair of said photoelectric conversion devices and said electric charge storage devices for a predetermined time;
   converting means for converting said electric charge into image data;
   developing means for applying toner onto a charged portion of a surface of said solid imaging means to form a toner image; and
   transferring means for transferring said toner image formed on said surface of said solid imaging means onto said recording medium.

5. The copying apparatus according to claim 4, wherein each of said matrix of electric charge storage devices comprises an anode made of composite material and a cathode made of lithium containing metals with polyelectrolyte material therebetween.

6. The copying apparatus according to claim 5, which further comprises display means for displaying said image data converted by said converting means.

7. The copying apparatus according to claim 5, which further comprises control means for controlling said converting means to execute a conversion process, first, for one of odd rows and even rows of said matrix of said electric charge storage devices, and then for another one of the odd rows and the even rows of said matrix of electric charge storage devices.

8. The copying apparatus according to claim 5, which further comprises control means for controlling said converting means to convert said electric charge in a predetermined area of said matrix of electric charge storage devices into said image data.

9. The copying apparatus according to claim 5, which further comprises a plurality of kinds of optical filters, each of said optical filters transmitting light having a predetermined wavelength, each of said optical filters being provided on a surface of a corresponding one of said photoelectric conversion devices; wherein said developing means comprises a plurality of toner applying means for applying toner of a color corresponding to said predetermined wavelength; and wherein said electric charge storage devices are all discharged except those carrying charge corresponding to a certain color and said developing means applies a toner of said certain color onto said collector surfaces.

10. A copying apparatus employing a light source for illuminating an original subject to be copied and forming a toner image corresponding to said original subject on a recording medium, said apparatus comprises:
solid imaging means for converting a reflected light from said original subject into electric charge and for storing said electric charge therein, said solid imaging means being provided with a chargeable surface on which said electric charge is to be collected;
converting means for converting said electric charge into image data;
memory means for saving said image data;
data processing means for processing said image data;
developing means for applying toner onto a charged surface of said solid imaging means to form a toner image; and
transferring means for transferring said toner image formed on said surface of said solid imaging means onto a recording medium.

11. The copying apparatus according to claim 10, wherein said solid imaging means comprises;
a matrix of photoelectric conversion devices for photoelectrically converting said reflected light into electric charge;
a matrix of electric charge storage devices for storing said electric charge, each of said matrix of electric charge storage devices corresponding to each of said matrix of photoelectric conversion devices, each of said electric charge storage devices being provided with a collecting surface for collecting said electric charge stored in said electric charge storage device; and
connecting means for connecting a selected pair of said matrix of photoelectric conversion device and said matrix of electric charge storage device for a predetermined period.

12. The copying apparatus according to claim 11, wherein each of said matrix of electric charge storage devices comprises an anode made of composite material and a cathode made of lithium containing metals with polyelectrolyte material therebetween.

13. The copying apparatus according to claim 12, wherein said image data processing means comprises operation means for providing an operation to said data saved in said memory means in order to reduce, magnify or correct an image to be formed.

14. The copying apparatus according to claim 13, wherein said data processing means comprises display means for displaying said image data operated by said operation means.

15. The copying apparatus according to claim 12, wherein said data processing means comprises:
charging means for charging said storage devices corresponding to said image data in said memory means; and
discharging means for discharging desired ones of said electric charge storage devices.

16. The copying apparatus according to claim 15, which further comprises a plurality of kinds of optical filters, each of said optical filters transmitting light having a predetermined wavelength, each of said optical filters being provided on a surface of a corresponding one of said photoelectric conversion devices;
wherein said developing means comprises a plurality of toner applying means for applying toner of a color corresponding to said predetermined wavelength; and
wherein said electric charge storage devices are all discharged except those carrying charge corresponding to a certain color and said developing means applies a toner of said certain color onto said collector surfaces.

17. The copying apparatus according to claim 12, wherein said data processing means comprises:
charging means for charging desired ones of said storage devices according to said data in said memory means; and
discharging means for discharging said storage devices.

18. The copying apparatus according to claim 17, which further comprises a plurality of kinds of optical filters, each of said optical filters transmitting light having a predetermined wavelength, each of said optical filters being provided on a surface of a corresponding one of said photoelectric conversion devices;
wherein said developing means comprises a plurality of toner applying means for applying toner of a color corresponding to said predetermined wavelength; and
wherein said discharging means discharges said matrix of electric charge storage devices, then said charging means charges said electric charge storage devices according to said image data corresponding to a certain color and said developing means applies toner of said certain color onto said collecting surface.

* * * * *